United States Patent
Javorka et al.

(10) Patent No.: US 8,497,180 B2
(45) Date of Patent: Jul. 30, 2013

(54) TRANSISTOR WITH BOOT SHAPED SOURCE/DRAIN REGIONS

(75) Inventors: Peter Javorka, Radeburg (DE); Stephan D. Kronholz, Dresden (DE); Matthias Kessler, Dresden (DE); Roman Boschke, Dresden (DE)

(73) Assignee: GlobalFoundries Inc., Grand Cayman (KY)

( * ) Notice: Subject to any disclaimer, the term of this patent is extended or adjusted under 35 U.S.C. 154(b) by 65 days.

(21) Appl. No.: 13/204,271

(22) Filed: Aug. 5, 2011

(65) Prior Publication Data

US 2013/0032864 A1   Feb. 7, 2013

(51) Int. Cl.
*H01L 21/00* (2006.01)
*H01L 21/02* (2006.01)

(52) U.S. Cl.
USPC ........... 438/305; 438/198; 438/299; 438/300; 257/190; 257/255; 257/336; 257/368; 257/369; 257/E21.214; 257/E21.232; 257/E21.335; 257/E21.431

(58) Field of Classification Search
USPC .................. 438/198, 299, 300, 305; 257/190, 257/255, 336, 368, 369, E21.214, E21.232, 257/E21.335, E21.431
See application file for complete search history.

(56) References Cited

U.S. PATENT DOCUMENTS

| | | | | |
|---|---|---|---|---|
| 5,349,225 | A * | 9/1994 | Redwine et al. | 257/336 |
| 6,521,502 | B1 * | 2/2003 | Yu | 438/305 |
| 7,045,407 | B2 * | 5/2006 | Keating et al. | 438/198 |
| 8,253,204 | B2 * | 8/2012 | Lee et al. | 257/368 |
| 2009/0032880 | A1 * | 2/2009 | Kawaguchi et al. | 257/369 |
| 2009/0068810 | A1 * | 3/2009 | Tsai et al. | 438/300 |
| 2010/0219474 | A1 * | 9/2010 | Kronholz et al. | 257/347 |

* cited by examiner

*Primary Examiner* — Dao H Nguyen
(74) *Attorney, Agent, or Firm* — Ditthavong Mori & Steiner, P.C.

(57) ABSTRACT

Devices are formed with boot shaped source/drain regions formed by isotropic etching followed by anisotropic etching. Embodiments include forming a gate on a substrate, forming a first spacer on each side of the gate, forming a source/drain region in the substrate on each side of the gate, wherein each source/drain region extends under a first spacer, but is separated therefrom by a portion of the substrate, and has a substantially horizontal bottom surface. Embodiments also include forming each source/drain region by forming a cavity to a first depth adjacent the first spacer and forming a second cavity to a second depth below the first cavity and extending laterally underneath the first spacers.

16 Claims, 3 Drawing Sheets

TRANSISTOR WITH BOOT SHAPED SOURCE/DRAIN REGIONS

TECHNICAL FIELD

The present disclosure relates to semiconductor devices with embedded silicon germanium source/drain regions. The present disclosure is particularly applicable to semiconductor devices in 32 nm and 28 nm technology nodes, and beyond.

BACKGROUND

Conventional complementary metal oxide semiconductor (CMOS) technology is highly effective for lower frequency applications. For higher speed applications that require high transistor switching rates, hole and electron mobility and other physical limitations may lower the extent to which CMOS devices can be utilized. The mobility of electrons traveling through the gate region is influenced greatly by the stress applied. Silicon germanium (SiGe) has been employed as source/drain electrodes for introducing strain into the gate by utilizing a difference in lattice constant between Si and SiGe. Further, with the recent trend of miniaturization, different shapes and configurations of source/drain regions have been attempted, for example using sigma shaped source and drain regions, such as sigma shaped regions with embedded SiGe. In sigma shaped regions the substrate is preferentially etched to form facets on the {111} surface. However, the {111} facets on the Si surface impede growth of embedded SiGe causing non-homogenous and poorly defined SiGe formation in the source/drain regions, which in turn lowers the final stress of embedded SiGe into the gate region.

A need therefore exists for methodology enabling formation of homogenous and well defined embedded SiGe growth within source/drain regions, and the resulting device.

SUMMARY

An aspect of the present disclosure is a method of fabricating a semiconductor device having a high stress transfer into the gate region by forming a somewhat boot shaped source/drain regions and growing embedded SiGe therein.

Another aspect of the present disclosure is a semiconductor device having a high stress transfer capability into the gate region, the device having a somewhat boot shaped source/drain regions having embedded SiGe grown therein.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method of fabricating a semiconductor device, the method including: forming a gate on a substrate; forming a first spacer on each side of the gate; and forming a source/drain region in the substrate on each side of the gate, wherein each source/drain region extends under the first spacer, but is separated therefrom by a portion of the substrate, and has a substantially horizontal bottom surface.

Aspects of the present disclosure include forming each source/drain region by forming a first cavity to a first depth adjacent the first spacer, and forming a second cavity to a second depth below the first cavity and extending laterally underneath the first spacers. Another aspect of the present disclosure is forming second spacers onto the first spacers subsequent to forming the first cavities. Other aspects include forming the first spacers of a nitride and second spacers of an oxide. Further aspects include removing the second spacers subsequent to forming the second cavities. Additional aspects include removing the second spacers using hydrogen fluoride (HF). Other aspects include growing embedded SiGe in the first and second cavities. Another aspect includes forming the first cavities by isotropic etching and forming the second cavities by anisotropic etching. Further aspects include forming the first spacers to a width of 40 Å to 150 Å. Additional aspects include forming the first cavities to the first depth of 150 Å to 200 Å, and forming the second cavities to the second depth, wherein the combined first and second depths total 800 Å. Other aspects include forming the second spacers to half the width of the first spacers.

Another aspect of the present disclosure is a device including: a substrate; a gate formed on the substrate; a spacer formed on each side of the gate; and a source and drain region in the substrate on each side of the gate, each source/drain region extending laterally beneath the spacers, but separated therefrom by a portion of the substrate, and having a substantially horizontal bottom surface.

Aspects include a device wherein each source/drain region has an upper portion and a lower portion, the upper portion having a depth of 150 Å to 200 Å and a width smaller than a width of the lower portion. Other aspects include a device wherein the spacers include nitride. Further aspects include a device wherein the spacers have a width of 40 Å to 150 Å. An additional aspect includes a device wherein the source/drain regions include embedded SiGe. Another aspect includes a device wherein the upper and lower portions of each source/drain region have a combined depth of 800 Å.

Another aspect of the present disclosure is a method including: forming a gate on a substrate; forming a silicon nitride (SiN) spacer on each side of the gate; isotropically etching the substrate adjacent the SiN spacers to form first cavities to a first depth; forming silicon dioxide ($SiO_2$) spacers on the SiN spacers and extending down to a bottom surface of the first cavity; anisotropically etching the substrate to a second depth to form a second cavity below the first cavity and extending laterally underneath the SiN spacer, the second cavity having an upper surface defined by a bottom surface of the $SiO_2$ spacers; removing the $SiO_2$ spacers using HF; and growing embedded SiGe within the cavities.

Aspects include a method wherein the first depth is 150 Å and the combined first and second depth is total 800 Å. Another aspect includes forming the SiN spacers to a width of 40 Å to 120 Å and forming the $SiO_2$ spacers to a width of 20 Å to 60 Å.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of low final stress of embedded SiGe source/drains into the gate channel region, attendant upon non-homogenous and poorly defined SiGe formation in the source/drain regions. In accordance with embodiments of the present disclosure a specific two-stage etching of the substrate is employed to create cavities for source/drain regions, the cavities having minimized facets and only the {001} surface for SiGe growth. As a result of the cavities having bottoms lacking curves or sharp angles, homogenous and well defined SiGe may be grown.

Methodology in accordance with embodiments of the present disclosure includes forming a gate on a substrate, forming a first spacer on each side of the gate and forming a source/drain region in the substrate on each side of the gate, wherein each source/drain region extends under a first spacer, but is separated therefrom by a portion of the substrate.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 1A through 1F schematically illustrate a process flow for fabricating a device, in accordance with an exemplary embodiment. Adverting to FIG. 1A, formation of the source/drain regions begins with formation of a gate 103 on a substrate 101. After the gate is patterned and etched, differential spacers 105 are deposited and etched on each side of gate 103. Spacers 105 may be formed of a nitride, for example SiN, and may be formed to the width of 40 Å to 150 Å.

Figure 1A:
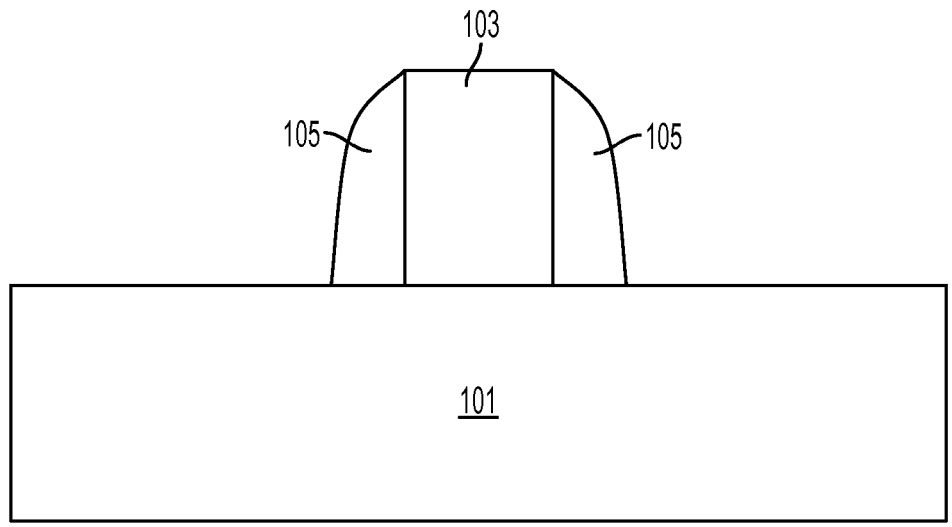
FIGS. 1A through 1F schematically illustrate a process flow of fabricating the device of the present disclosure, in accordance with an exemplary embodiment.
Figure 1B:
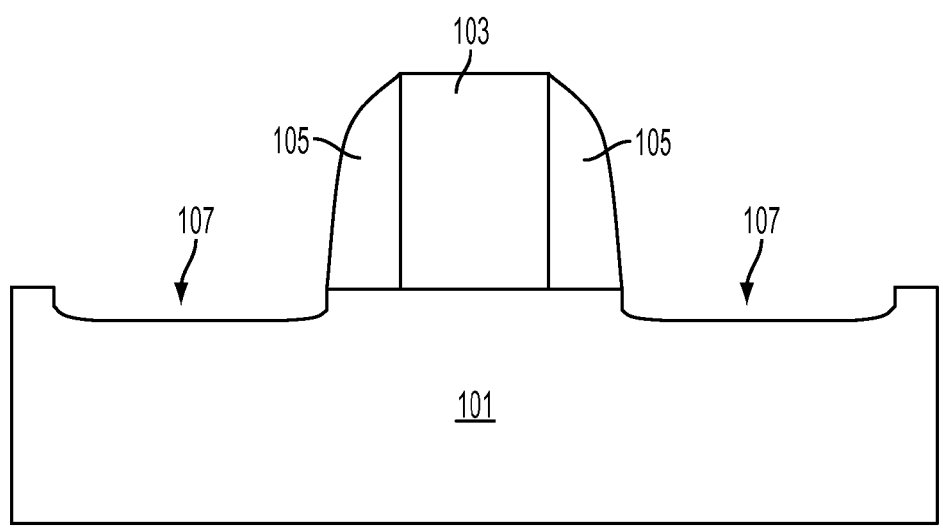

As illustrated in FIG. 1B a shallow cavity 107 is etched adjacent each spacer 105. Cavities 107 are etched isotropically, for example using tetrafluoromethane (CF4) reactive ion etching (RIE) or hydrogen bromide (HBr), to a depth of 150 Å to 200 Å, with a width depending on neighboring transistors.

Figure 1C:
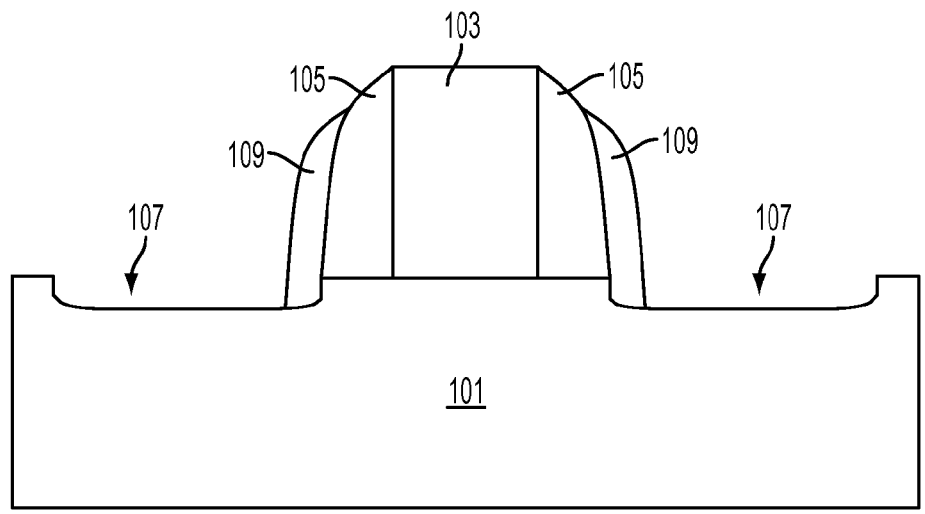

Adverting to FIG. 1C, differential spacers 109 are deposited and etched onto spacers 105 and extending to the bottom of cavities 107. Width of spacers 109 is half the width of spacers 105, i.e., 20 Å to 60 Å. Spacers 109 may be formed of an oxide, for example $SiO_2$.

Figure 1D:
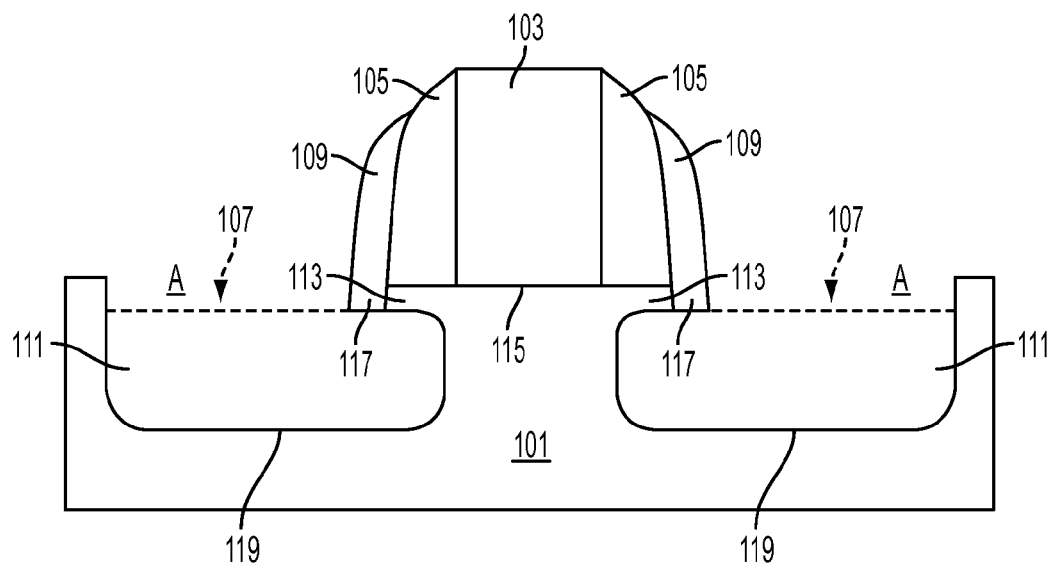

As illustrated in FIG. 1D, cavities 107 are further etched to form cavities 111, where the combined depth of cavities 107 and respective cavities 111 totals 800 Å. Cavities 111 are obtained by anisotropic etching, for example, by using potassium hydroxide (KOH) or tetramethylammonium hydroxide (TMAH) wet etch. Cavities 111 extend underneath spacers 105 and 109, up to lines that define vertical surfaces of gate 103, and are separated from spacers 105 by a portion 113 of substrate 101. The thickness of a portion 113 of substrate 101 depends on the distance from a line defined by the bottom 115 of gate 103 to the line A defined by bottom surface 117 of spacers 109. Line A also defines the upper surfaces of cavities 111. As a result of the isotropic and anisotropic etching, bottom surfaces 119 acquire surface orientation {001}.

Figure 1E:
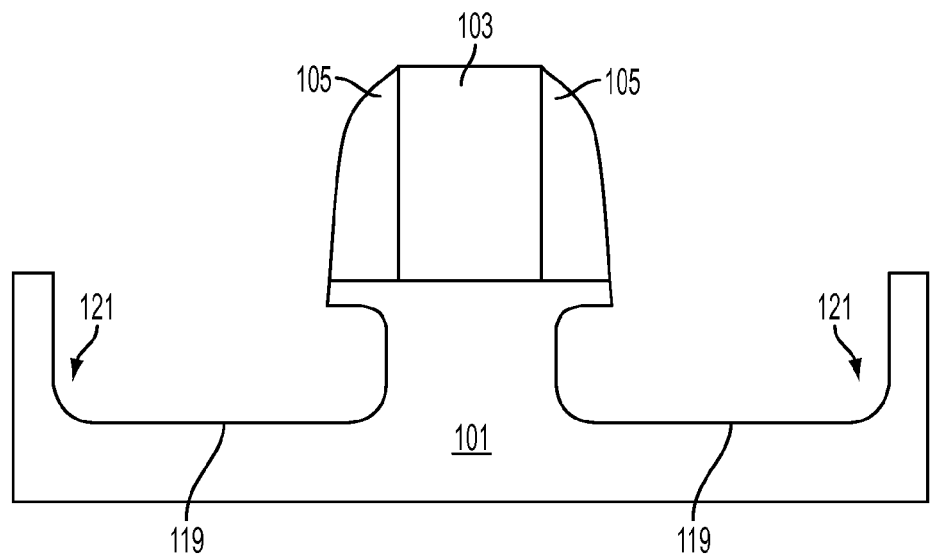

Adverting to FIG. 1E, after cavities 111 are etched, spacers 109 are removed using HF. Then, the combined respective cavities 107 and 111 create somewhat boot shaped spaces that will serve as source/drain regions 121, having bottom surfaces 119.

Figure 1F:
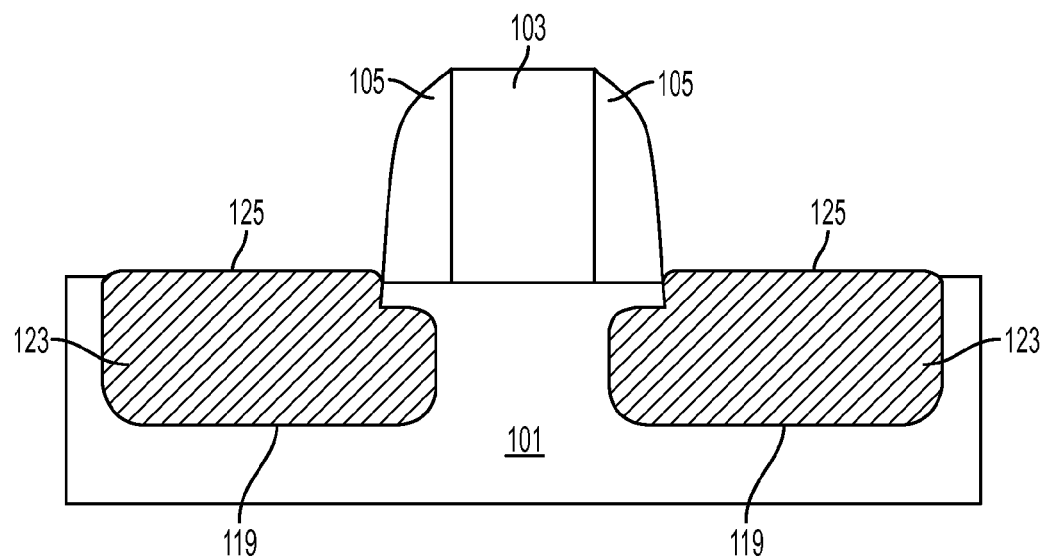

As illustrated in FIG. 1F, embedded SiGe is grown epitaxially in source/drain regions 121 to form source/drains 123. Bottom surfaces 119 of source/drain regions 121 ensure homogenous and well defined SiGe formation, that will enable achievement of appropriate stress to gate 103. Surfaces 125 of source/drains 123 are substantially flush with the surface of substrate 101 prior to etching of cavities 107. Remaining spacers 105 can be further utilized, for example, as implant spacers for halo and extension implants.

The embodiments of the present disclosure can achieve several technical effects, including increased and uniform stress to the gate channel region and improved transistor speed and performance. Additionally, reliability of the transistor is increased due to smaller amount of growth defects in the embedded SiGe. The present disclosure enjoys industrial applicability in any of various types of highly integrated semiconductor devices, particularly in 32 nm and 28 nm technology nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a gate on a substrate;
   forming a nitride first spacer on each side of the gate;
   forming a first cavity to a first depth adjacent each first spacer;
   forming oxide second spacers onto the first spacers subsequent to forming the first cavities;
   forming a second cavity to a second depth below each first cavity and extending laterally underneath the first spacer;
   removing the second spacers subsequent to forming the second cavities; and
   forming a source/drain region in the substrate on each side of the gate, in the first and second cavities, wherein each source/drain region extends under a first spacer, but is separated therefrom by a portion of the substrate, and has a substantially horizontal bottom surface.

2. The method according to claim 1, comprising removing the second spacers using hydrogen fluoride (HF).

3. The method according to claim 2, comprising growing embedded silicon germanium (SiGe) in the first and second cavities.

4. The method according to claim 3, comprising forming the first cavities by isotropic etching and forming the second cavities by anisotropic etching.

5. The method according to claim 4, comprising forming the first spacers to a width of 40 Å to 150 Å.

6. The method according to claim 5, comprising forming the first cavities to the first depth of 150 Å to 200 Å, and forming the second cavities to the second depth, wherein the combined first and second depths total 800 Å.

7. A method according to claim 6, comprising forming the second spacers to half the width of the first spacers.

8. A device comprising:
   a substrate;
   a gate formed on the substrate;
   a spacer formed on each side of the gate; and
   a source/drain region in the substrate on each side of the gate, each source/drain region having upper portion having a substantially vertical side edge substantially aligned with an outer edge of the spacer and a lower portion below the upper portion and extending laterally beneath the spacer, but separated therefrom by a portion of the substrate, the lower portion having a substantially vertical side edge substantially aligned with an edge of the gate, and each source/drain region having a substantially horizontal bottom surface.

9. The device according to claim 8, wherein the upper portion of each source/drain region has a depth of 150 Å to 200 Å and a width smaller than a width of the lower portion.

10. The device according to claim 9, wherein the spacers comprise nitride.

11. The device according to claim 10, wherein the spacers have a width of 40 Å to 150 Å.

12. The device according to claim 11, wherein the source/drain regions comprise embedded SiGe.

13. The device according to claim 12, wherein the upper and lower portions of each source/drain region have a combined depth of 800 Å.

14. A method comprising:
   forming a gate on a substrate;
   forming a silicon nitride (SiN) spacer on each side of the gate;
   isotropically etching the substrate adjacent the SiN spacers to form first cavities to a first depth;
   forming silicon dioxide ($SiO_2$) spacers on the SiN spacers and extending down to a bottom surface of the first cavity;
   anisotropically etching the substrate to a second depth to form a second cavity below the first cavity and extending laterally underneath the SiN spacers, the second cavity having a substantially horizontal bottom surface and having an upper surface defined by a bottom surface of the $SiO_2$ spacers;
   removing the $SiO_2$ spacers using HF; and
   growing embedded SiGe within the cavities.

15. The method according to claim 14, wherein the first depth is 150 Å to 200 Å and the combined first and second depths total 800 Å.

16. The method according to claim 15, comprising forming the SiN spacers to a width of 40 Å to 120 Å and forming the $SiO_2$ spacers to a width of 20 Å to 60 Å.

* * * * *